United States Patent
Lee et al.

(10) Patent No.: US 10,964,549 B2
(45) Date of Patent: Mar. 30, 2021

(54) WAFER POLISHING WITH SEPARATED CHEMICAL REACTION AND MECHANICAL POLISHING

(71) Applicant: TAIWAN SEMICONDUCTOR MANUFACTURING COMPANY LIMITED, Hsin-Chu (TW)

(72) Inventors: Shen-Nan Lee, Jhudong Township (TW); Teng-Chun Tsai, Hsinchu (TW); Chu-An Lee, Hsinchu (TW); Chen-Hao Wu, Hsinchu (TW); Chun-Hung Liao, Taichung (TW); Huang-Lin Chao, Hillsboro, OR (US)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 16/283,928

(22) Filed: Feb. 25, 2019

(65) Prior Publication Data
US 2020/0176264 A1   Jun. 4, 2020

Related U.S. Application Data

(60) Provisional application No. 62/774,045, filed on Nov. 30, 2018.

(51) Int. Cl.
| | |
|---|---|
| *H01L 21/02* | (2006.01) |
| *H01L 21/3105* | (2006.01) |
| *B24B 37/04* | (2012.01) |
| *C09G 1/02* | (2006.01) |
| *C09K 3/14* | (2006.01) |

(52) U.S. Cl.
CPC ...... *H01L 21/31055* (2013.01); *B24B 37/044* (2013.01); *C09G 1/02* (2013.01); *C09K 3/1409* (2013.01); *H01L 21/0223* (2013.01); *H01L 21/02065* (2013.01)

(58) Field of Classification Search
CPC ......... H01L 21/31055; H01L 21/02065; H01L 21/0223; H01L 21/31053; H01L 21/3212; B24B 37/044; C09G 1/02; C09K 3/1409; C09K 3/1463
USPC ....... 438/692, 693, 694, 745, 750, 756, 770; 134/1.3, 1.1, 1.2
See application file for complete search history.

(56) References Cited

U.S. PATENT DOCUMENTS

| | | | | |
|---|---|---|---|---|
| 7,947,637 B2 * | 5/2011 | Kneer | ............... | H01L 21/02071 510/175 |
| 2003/0082904 A1 * | 5/2003 | Saka | .................... | B24B 37/042 438/633 |
| 2009/0209090 A1 * | 8/2009 | Yokoyama | .......... | H01L 29/6606 438/476 |
| 2010/0048007 A1 * | 2/2010 | Lee | .................... | H01L 21/3212 438/585 |
| 2013/0217229 A1 * | 8/2013 | Haga | ........................ | C08G 1/02 438/693 |

(Continued)

*Primary Examiner* — Lan Vinh
(74) *Attorney, Agent, or Firm* — Cooper Legal Group, LLC

(57) ABSTRACT

A wafer is polished by performing a chemical reaction to change a property of a first portion of a material layer on the wafer using a first chemical substance. A first rinse is performed to remove the first chemical substance and retard the chemical reaction. A mechanical polishing process is then performed to remove the first portion of the material layer.

20 Claims, 10 Drawing Sheets

(56) References Cited

U.S. PATENT DOCUMENTS

2015/0162181 A1* 6/2015 Yamashita .............. B24B 37/08
                                                    438/691
2017/0309494 A1* 10/2017 Osterheld ......... H01L 21/67092

* cited by examiner

WAFER POLISHING WITH SEPARATED CHEMICAL REACTION AND MECHANICAL POLISHING

RELATED APPLICATION

This application claims priority to U.S. Provisional Application 62/774,045, titled "WAFER POLISHING WITH SEPARATED CHEMICAL REACTION AND MECHANICAL POLISHING" and filed on Nov. 30, 2018, which is incorporated herein by reference.

BACKGROUND

Chemical mechanical polishing (CMP) technology is used to manufacture semiconductor integrated circuits. During chemical mechanical polishing, a wafer comprising materials for forming integrated circuits is polished face down by rotating the wafer against a polishing pad while a force is applied to press the wafer against the polishing pad.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
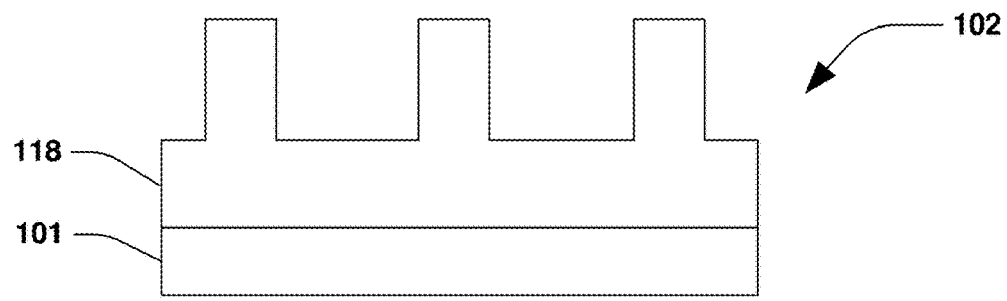
FIG. 1A is an illustration of a cross-sectional view of a wafer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As provided herein, in some embodiments a polishing process is performed upon a semiconductor wafer comprising die in which integrated circuits are formed, where a chemical reaction to soften a top surface of a material layer being polished is separated in time from a mechanical polishing process. In some embodiments, separating the chemical reaction from the mechanical polishing process reduces uncertainties otherwise resulting from complexities due to interactions between the material layer being polished, chemical slurries, abrasive particles, and a polishing pad.

In some embodiments, the chemical reaction and mechanical polishing process are iteratively repeated while parameters of the mechanical polishing process are controlled to achieve a removal rate of less than about 2 nanometers of material per polishing cycle or less than about 10 nanometers of material per minute, thereby achieving quasi atomic layer removal. In some embodiments, the parameters of the mechanical polishing process that are controlled include a force applied between the wafer and the polishing pad, a solid content of a slurry, a particle size of abrasives contained within the slurry, etc. For example, in some embodiments, about 0.5 pounds per square inch (psi) or less of pressure is applied against the semiconductor wafer by a polishing pad or applied against the polishing pad by the semiconductor wafer during the mechanical polishing process. In some embodiments, a slurry comprising a concentration of solid content, such as abrasive particles, of about 0.5 weight percentage (wt %) or less is used during the mechanical polishing process. In some embodiments, the mechanical polishing process uses a slurry comprising abrasive particles each having a size of about 30 nanometers or less or having an average size of about 30 nanometers or less.

FIGS. 1A-1I are illustrations of a polishing process of a semiconductor wafer and cross-sectional views of the semiconductor wafer during the polishing process according to some embodiments. Referring to FIG. 1A, a semiconductor wafer 102 comprises a material layer 118 that is to be polished. The material layer 118 is disposed over a substrate 101. In the illustrated embodiment, the material layer 118 is disposed directly on the substrate 101. In other embodiments, one or more intervening layers are disposed between the substrate 101 and the material layer 118. The material layer 118 comprises a metal or other suitable material for polishing. In some embodiments, the material layer 118 comprises silicon dioxide ($SiO_2$), silicon nitride (SiN), poly silicon (Poly-Si), aluminum (Al), tungsten (W), titanium nitride (TiN), titanium (Ti), tantalum nitride (TaN), tantalum (Ta), hafnium oxide ($HfO_x$), zirconium oxide ($ZrO_x$), aluminum zirconium oxide ($AlZrO_x$), titanium aluminum carbide (TiAlC), titanium aluminide (TiAl), cobalt (Co), ruthenium (Ru), amorphous silicon (a-Si), nickel silicide (NiSi), cobalt silicide (CoSi), cobalt nickel silicide (CoNiSi), aluminum oxide ($AlO_x$), iridium oxide ($IrO_x$), copper (Cu), low-k dielectric, silicon oxynitride (SiON), silicon carbonitride (SiCN), nitrogen-free anti-reflective coating (NFARC), silicon oxycarbide (SiOC), silicon carbide (SiC), silicon oxycarbonitride (SiOCN), or other material.

As used herein, low-k dielectric refers to dielectric materials have a k-value (dielectric constant) lower than about 3.9. Some low-k dielectric materials have a k-value lower than about 3.5 and may have a k-value lower than about 2.5.

In some embodiments, the polishing process is used for a shallow trench isolation (STI) fabrication process during front-end of line chemical mechanical polishing to polish materials such as silicon dioxide ($SiO_2$), silicon nitride (SiN), or other suitable materials. In some embodiments, the polishing process is used for a poly gate fabrication process during front-end of line chemical mechanical polishing to polish materials such as poly silicon (Poly-Si), silicon dioxide ($SiO_2$), silicon nitride (SiN), or other suitable materials. In some embodiments, the polishing process is used for an inter-layer dielectric fabrication process during front-end of line chemical mechanical polishing to polish materials such as silicon dioxide ($SiO_2$), silicon nitride (SiN), or other suitable materials. In some embodiments, the polishing process is used for a metal gate fabrication process during middle-end of line chemical mechanical polishing to polish materials such as aluminum (Al), tungsten (W), titanium nitride (TiN), titanium (Ti), tantalum nitride (TaN), tantalum (Ta), hafnium oxide ($HfO_2$), zirconium oxide ($ZrO_x$), aluminum zirconium oxide ($AlZrO_x$), titanium aluminum carbide (TiAlC), titanium aluminide (TiAl), or other suitable materials. In some embodiments, the polishing process is used for a metal plug fabrication process during middle-end of line chemical mechanical polishing to polish materials such as tungsten (W), cobalt (Co), ruthenium (Ru), aluminum (Al), titanium nitride (TiN), titanium (Ti), tantalum nitride (TaN), tantalum (Ta), silicon dioxide ($SiO_2$), silicon nitride (SiN), amorphous silicon (a-Si), zirconium oxide ($ZrO_x$), nickel silicide (NiSi), cobalt silicide (CoSi), cobalt nickel silicide (CoNiSi), aluminum oxide ($AlO_x$), iridium oxide ($IrO_x$), or other suitable materials. In some embodiments, the polishing process is used for a copper (Cu) line fabrication process during back-end of line chemical mechanical polishing to polish materials such as copper (Cu), cobalt (Co), ruthenium (Ru), tantalum nitride (TaN), tantalum (Ta), silicon dioxide ($SiO_2$), low-k dielectric, silicon carbonitride (SiCN), nitrogen-free anti-reflective coating (NFARC), silicon carbide (SiC), silicon oxycarbonitride (SiOCN), silicon oxycarbide (SiOC), or other suitable materials.

Figure 4:
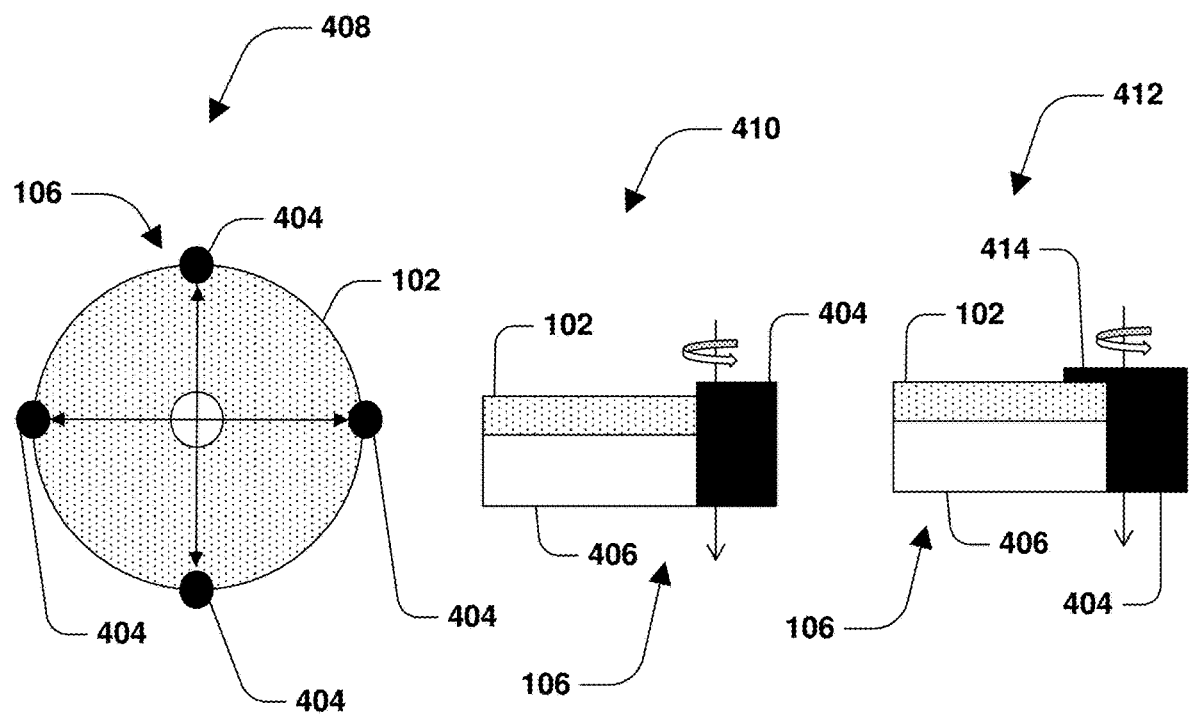
FIG. 4 is an illustration of a wafer holder, in accordance with some embodiments.

In some embodiments, the polishing process is performed by a polishing apparatus 100. The polishing apparatus 100 comprises a wafer holder 106 configured to hold the semiconductor wafer 102 during the polishing process. FIG. 4 is an illustration of a top-down view 408 and side views 410, 412 of the wafer holder 106 in accordance with some embodiments. In some embodiments, the wafer holder 106 comprises a platform 406 upon which the semiconductor wafer 102 is placed and one or more locking structures 404 used to hold the semiconductor wafer 102 in place against the platform 406 so that the semiconductor wafer 102 does not move or slip within the wafer holder 106 during the polishing process. In some embodiments, the locking structures 404 are rotatable between a locked position, during which lips 414 of the locking structures 404 overlie the semiconductor wafer 102, and an unlocked position, during which the lips 414 of locking structures 404 do not overlie the semiconductor wafer 102. For example, in the side view 412, which depicts a locking structure 404 in a locked position, the lip 414 overlies the semiconductor wafer 102. In the side view 410, which depicts the locking structure 404 in an unlocked position, the lip 414 extends into or out of the page.

Returning to FIG. 1B, in some embodiments the polishing apparatus 100 comprises a turntable 104 configured to rotate during the polishing process, such as during applying of a chemical substance during the chemical reaction portion of the polishing process or during a subsequent mechanical polishing portion of the polishing process. In some embodiments, the polishing apparatus 100 comprises a material dispensing apparatus 114 configured to dispense a first chemical substance 116 on the semiconductor wafer 102, such as during the chemical reaction portion of the polishing process. In some embodiments, the polishing apparatus 100 comprises a slurry dispensing apparatus 112 configured to dispense a slurry material on the semiconductor wafer 102, such as during the mechanical polishing portion of the polishing process. In some embodiments, the polishing apparatus 100 comprises a dresser arm 108 to which the polishing pad 110 is attachable for moving the polishing pad 110 relative to the semiconductor wafer 102. In some embodiments, the dresser arm 108 is configured to rotate the polishing pad 110 against the semiconductor wafer 102 during the polishing process, such as during a subsequent mechanical polishing process.

In some embodiments, such as in the illustrated embodiment, the polishing pad 110 is smaller than the semiconductor wafer 102. For example, a diameter of the polishing pad 110 may be less than a diameter of the semiconductor wafer 102. In some embodiments, the diameter of the polishing pad 110 is selected to be smaller than a single die within the semiconductor wafer 102. In this way, the polishing pad can polish merely a portion of a wafer or a portion of a die to fine-tune polishing and improve within die and within wafer uniformity and topography, for example. In other embodiments, the polishing pad 110 is at least as large as the semiconductor wafer 102. For example, the polishing pad 110 may have a diameter that is greater than or equal to a diameter of the semiconductor wafer 102.

Figure 1B:
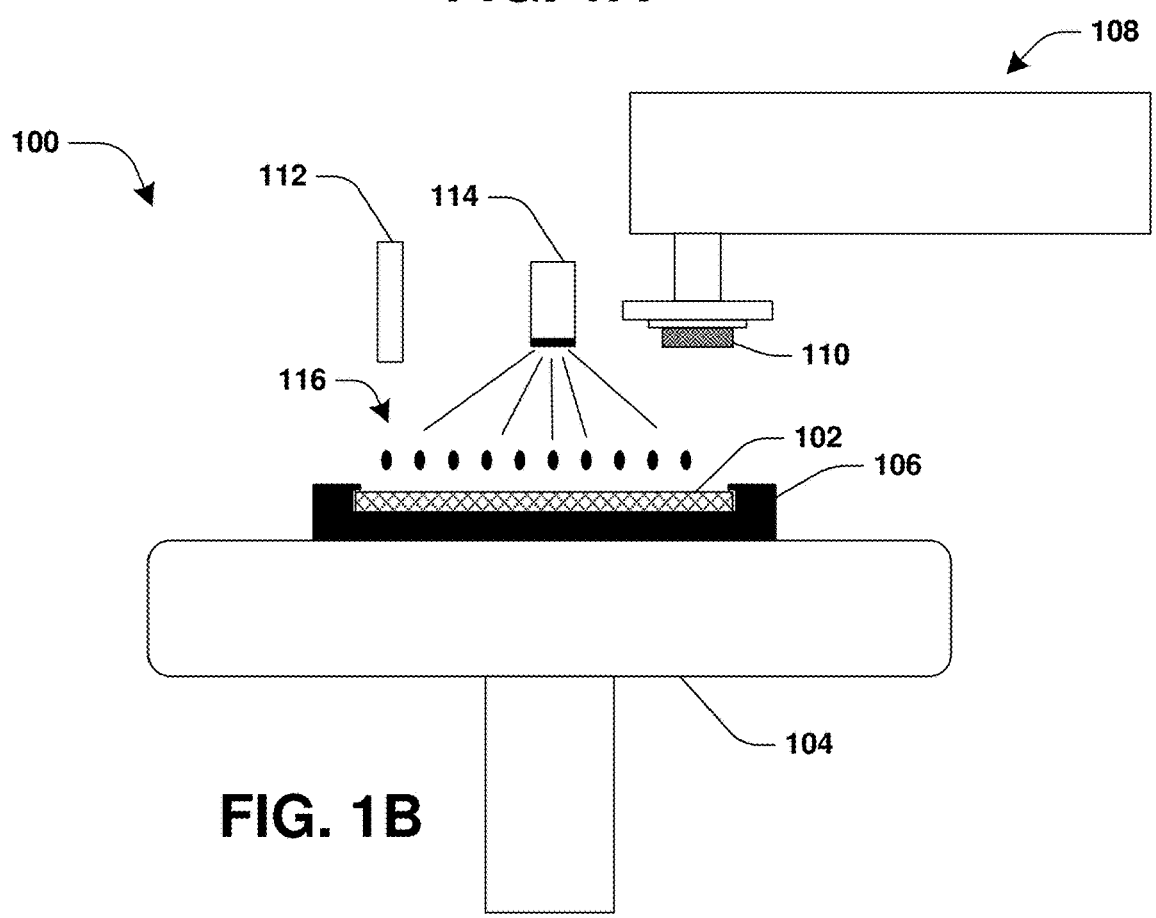
FIG. 1B is an illustration of an oxidization process being performed upon a wafer, in accordance with some embodiments.

While FIG. 1B illustrates that polishing pad 110 as on top of or overlying the semiconductor wafer 102, the wafer holder 106, and the turntable 104, in some embodiments, the dresser arm 108 and the polishing pad 110 are disposed below the semiconductor wafer 102, the wafer holder 106, and the turntable 104 such that a surface of the polishing pad 110 performing the polishing faces upward and a surface of the semiconductor wafer 102 to be polished faces downward, as illustrated and described later in conjunction with FIG. 3 according to some embodiments. Moreover, in some embodiments, the material dispensing apparatus 114 is configured to dispense the first chemical substance 116 on the polishing pad 110 instead of or in addition to dispensing the first chemical substance 116 on the semiconductor wafer 102. In some embodiments, the slurry dispensing apparatus 112 is configured to dispense the slurry material on the polishing pad 110 instead of or in addition to dispensing the first chemical substance 116 on the semiconductor wafer 102.

Operation of the polishing apparatus 100 is described in further detail in conjunction with FIGS. 1B-1I and 2A-2H.

Figure 1C:
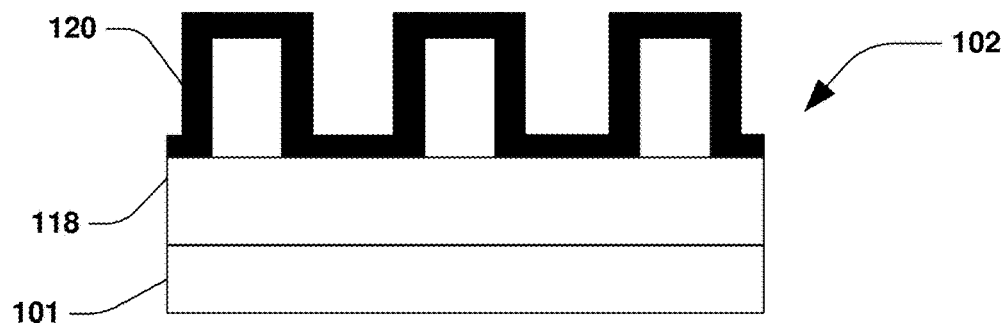
FIG. 1C is an illustration of a cross-sectional view of a wafer, in accordance with some embodiments.

Referring to FIG. 1B, a chemical reaction is performed to change a property of a first portion of the material layer 118 on the semiconductor wafer 102, such as an upper portion of the material layer 118, using a first chemical substance 116, in accordance with some embodiment. In some embodiments, the material dispensing apparatus 114 dispenses the first chemical substance 116 onto the first portion of the material layer 118 to oxidize the first portion and the oxidation corresponds to the chemical reaction. In some embodiment, the material dispensing apparatus 114 dispenses the first chemical substance 116 while the turntable 104 is rotated to rotate the semiconductor wafer 102 relative to the material dispensing apparatus 114. In some embodiment, the material dispensing apparatus 114 dispenses the first chemical substance 116 while the turntable 104 is stationary such that a position of the semiconductor wafer 102 is fixed relative to the material dispensing apparatus 114 while dispensing the first chemical substance 116. As a result of the oxidization, an oxidized layer 120 is created on the semiconductor wafer 102 from the first portion of the material layer 118, as depicted by FIG. 1C.

In some embodiments, the oxidized layer 120 is softer than the material layer 118. In some embodiments, the softness of the oxidized layer 120 enables the polishing process to create a smoother wafer surface. In some embodiments, the first chemical substance comprises at least one of hydrogen peroxide, another oxidation agent, or other suitable material that will soften or otherwise change a property of the first portion of the material layer 118. In some embodiments, performance of the chemical reaction is not performed, such as where the material layer 118 already comprises an oxidized material. In some embodiments, the chemical reaction is performed upon the material layer 118 even when the material layer 118 comprises an oxidized material in order to increase a concentration of oxygen within a portion of the material layer 118 or otherwise soften a portion of the material layer 118. Thus, in some embodiments, the first chemical reaction causes a first portion of the material layer 118 to have a first concentration of oxygen and a second portion of the material layer 118 to have a second concentration of oxygen, different than the first concentration. In some embodiments, the first portion overlies the second portion and the first concentration is greater than the second concentration.

Figure 1D:
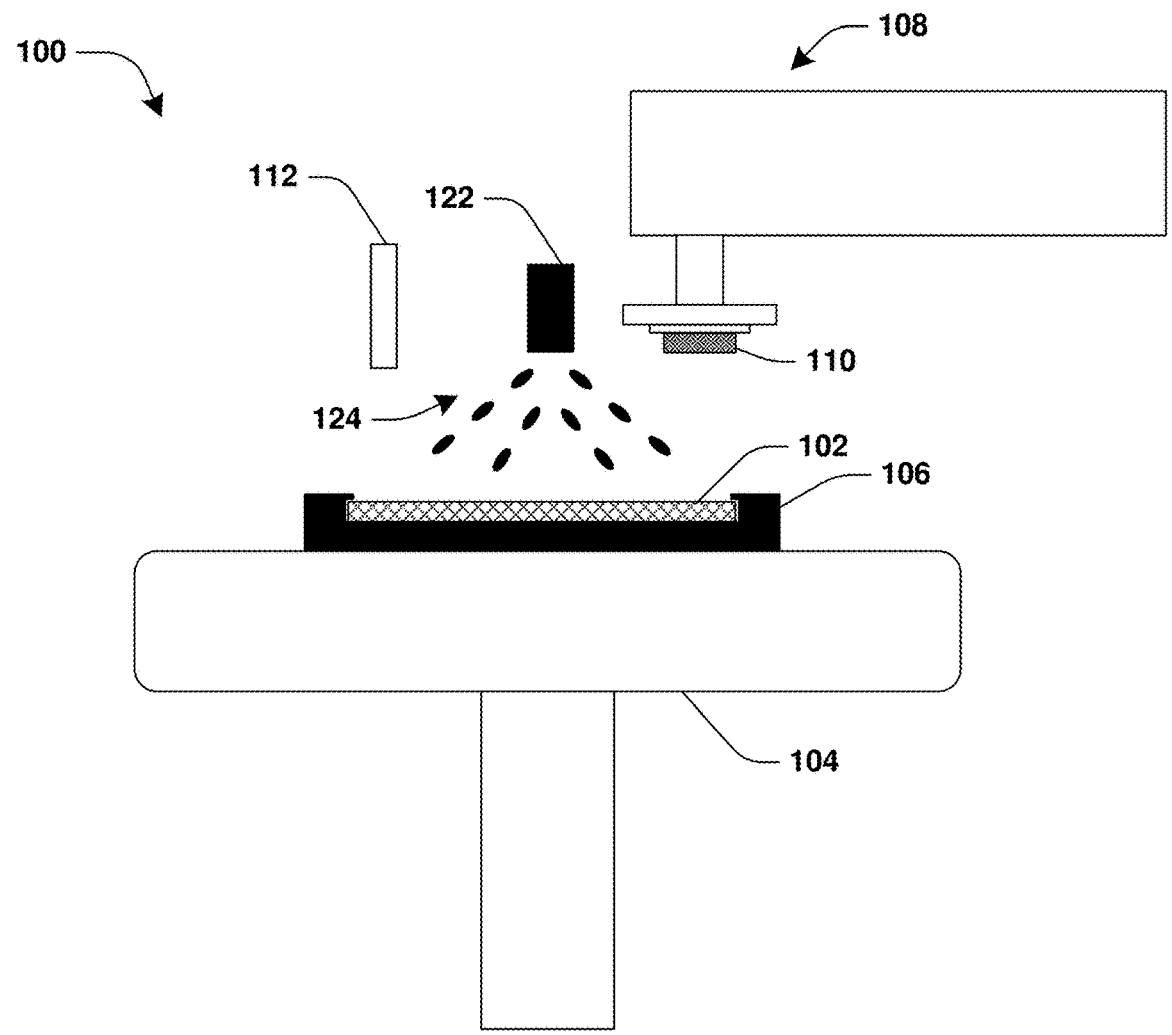
FIG. 1D is an illustration of a rinse being performed upon a wafer, in accordance with some embodiments.

Referring to FIG. 1D, a first rinse is performed after the first chemical reaction, such as after the oxidization that created the oxidized layer 120 over the material layer 118, is performed, in accordance with some embodiment. In some embodiments, the first rinse is performed to remove the first chemical substance 116 that was used to perform the first chemical reaction. In some embodiments, the first rinse is performed to retard the first chemical reaction. In some embodiments, the polishing apparatus 100 comprises a rinse apparatus 122 configured to dispense a rinse material 124 on the semiconductor wafer 102 to perform the first rinse. In some embodiment, the rinse apparatus 122 dispenses the rinse material 124 while the turntable 104 is rotated to rotate the semiconductor wafer 102 relative to the rinse apparatus 122. In some embodiment, the rinse apparatus 122 dispenses the rinse material 124 while the turntable 104 is stationary such that a position of the semiconductor wafer 102 is fixed relative to the rinse apparatus 122 while dispensing the rinse material 124.

Figure 1E:
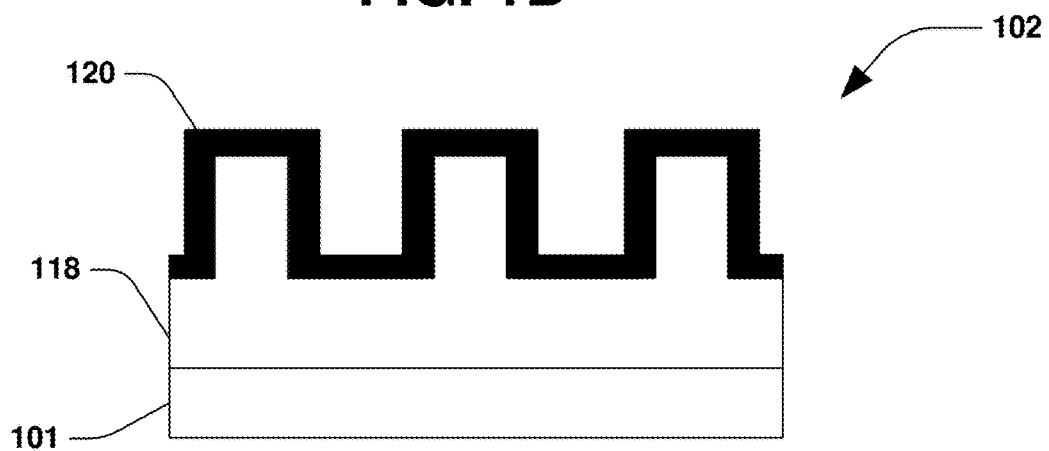
FIG. 1E is an illustration of a cross-sectional view of a wafer, in accordance with some embodiments.

In some embodiments, the rinse material 124 comprises deionized water or other material that will remove the first chemical substance and retard the first chemical reaction. In some embodiments, the first rinse removes remaining oxidizer prior to subsequent mechanical polishing. FIG. 1E is a perspective side view of the semiconductor wafer 102 after the first rinse has been performed.

Because the first rinse retards the first chemical reaction after the first chemical reaction is performed, the chemical reaction is separated from a mechanical polishing process that occurs after the first rinse. Separating the first chemical reaction and mechanical polishing mitigates uncertainties otherwise resulting from complexities due to interactions between the material layer 118 being polished, chemical slurries, abrasive particles, and the polishing pad 110.

Figure 1F:
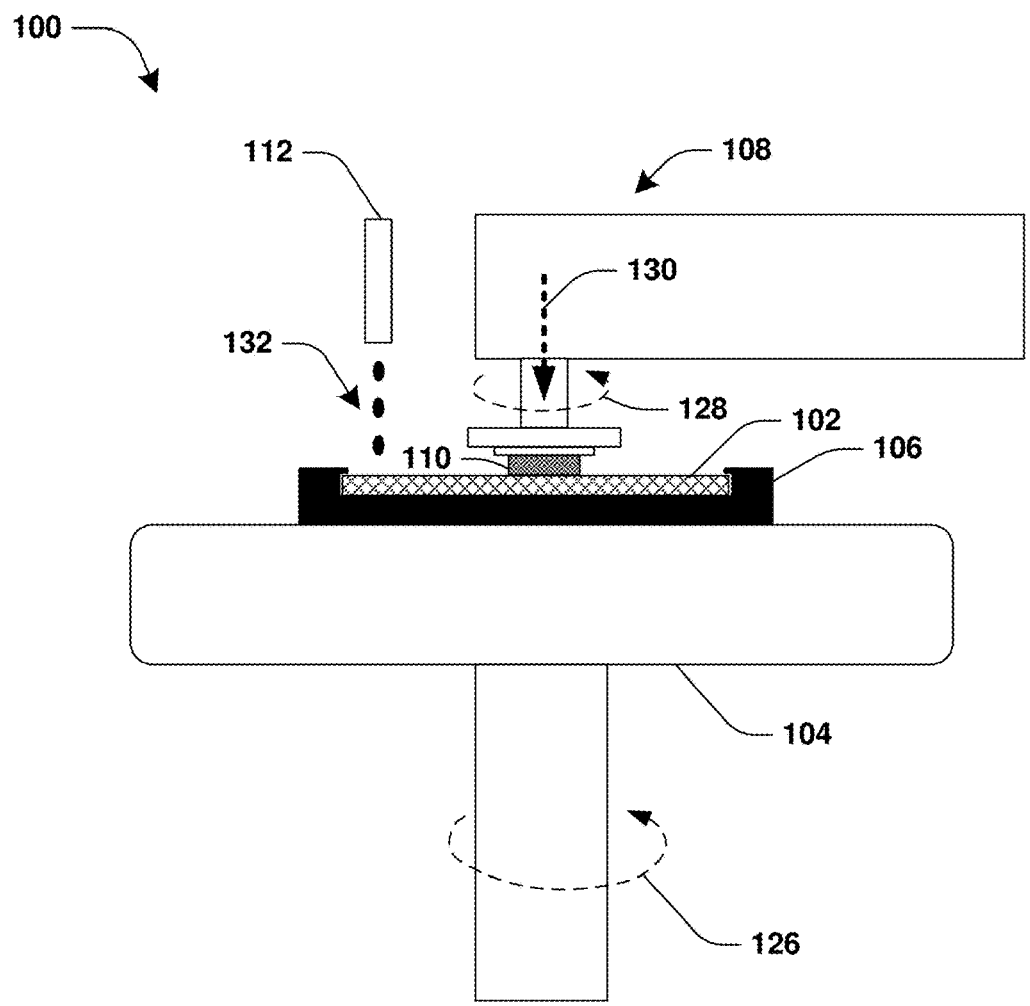
FIG. 1F is an illustration of a mechanical polish being performed upon a wafer, in accordance with some embodiments.
Figure 1G:
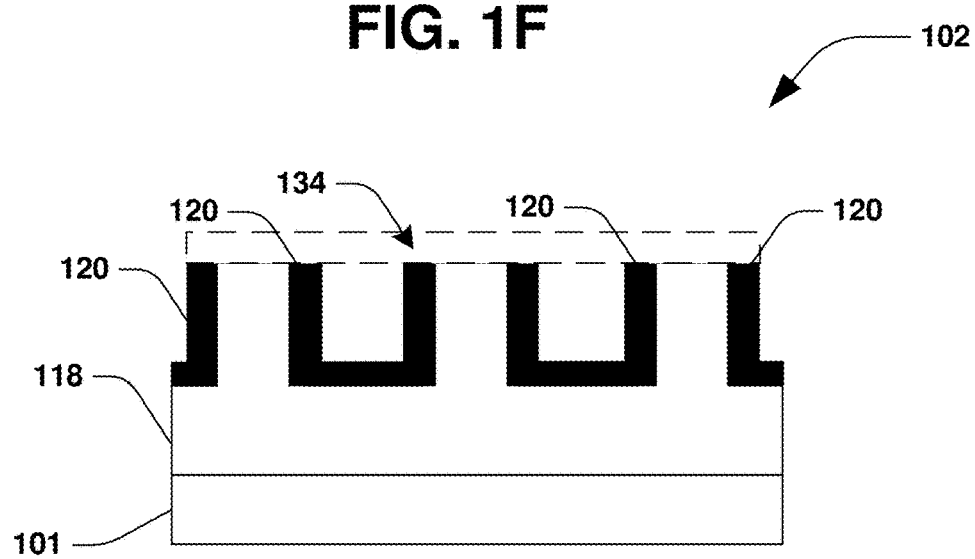
FIG. 1G is an illustration of a cross-sectional view of a wafer, in accordance with some embodiments.

Referring to FIG. 1F, a mechanical polishing process is performed after the first chemical reaction and after the first rinse is performed to retard the first chemical reaction, in accordance with some embodiments. In some embodiments, the mechanical polishing process is performed to remove 134 a portion of the material layer 118, such as a top portion of the oxidized layer 120, as illustrated in FIG. 1G. In some embodiments, during the mechanical polishing process, the dresser arm 108 is operated to move the polishing pad 110 to contact with the semiconductor wafer 102. In some embodiments, the dresser arm 108 rotates 128 the polishing pad 110 against a surface of the semiconductor wafer 102, such as a top surface of the oxidized layer 120. In some embodiments, the dresser arm 108 is controlled to apply about 0.5 psi or less of pressure 130, such as downward force, against the semiconductor wafer 102 by the polishing pad 110. In some embodiments, the turntable 104 is controlled to apply about 0.5 psi or less of pressure 130, such as upward force, against the polishing pad 110. In some embodiments, the turntable 104 is operated to rotate 126 the semiconductor wafer 102 against the polishing pad 110 during the mechanical polishing process.

The polishing pad 110 can be a same size as the semiconductor wafer 102, smaller than the semiconductor wafer 102, or larger than the semiconductor wafer 102. If the polishing pad 110 is smaller than the semiconductor wafer 102, the polishing process can be used to polish fewer than all die of the semiconductor wafer 102, in some embodiments. In this way, in some embodiments, the polishing process can be used to rework/repair a single bad die or multiple bad dies without polishing all dies of the semiconductor wafer 102 or can be used to adjust the topology of a portion of the wafer during the polishing process. In some embodiments, the polishing pad 110 has a surface flatness of about 1 micrometer or less. In some embodiments, a relatively stiffer polishing pad 110 is used to help control polishing pad surface temperature. In some embodiments, the polishing pad 110 has a hardness between about 15 Shore D and about 65 Shore D.

During the mechanical polishing process, the slurry dispensing apparatus 112 is configured to dispense a slurry 132 on at least one of the semiconductor wafer 102 or the polishing pad 110. The slurry 132 is used to aid the mechanical polishing process to remove 134 the portion of the material layer 118, such as the top portion of the oxidized layer 120, to expose a second portion of the material layer 118 under the first portion of the material layer 118. In some embodiments, the slurry 132 comprises a concentration of solid content of about 0.5 weight percentage (wt %) or less. In some embodiments, the solid content comprises abrasive particles. In some embodiments, each abrasive particle has a size of about 30 nanometers or less. In some embodiments, an average size of the abrasive particles is about 30 nanometers or less. In some embodiments, the abrasive particles comprise at least one of silicon dioxide ($SiO_2$), cerium dioxide ($CeO_2$), aluminum oxide ($Al_2O_3$), titanium dioxide ($TiO_2$), zirconium dioxide ($ZrO_2$), a polymer particle, a surface-modified abrasive such as a titanium dioxide ($TiO_2$) core coated with silicon dioxide ($SiO_2$), a polymer core coated with silicon dioxide ($SiO_2$), etc. In some embodiments, the low concentration of solid content reduces interactions between the semiconductor wafer 102, chemical slurries, abrasive particles, and the polishing pad 110 in order to improve surface smoothness.

In some embodiments, the slurry 132 comprises a surfactant, such as an ionized or deionized surfactant that aids in the removal 134 of the portion of the material layer 118, such as to aid in removal of metal oxide from the oxidized layer 120. In some embodiments, the surfactant comprises an anionic surfactant, such as dioctyl sodium sulfosuccinate (DOSS), perfluorooctanesulfonate (PFOS), linear alkylbenzene sulfonates, sodium lauryl ether sulfate, lignosulfonate, sodium stearate, or other composition. In some embodiments, the surfactant comprises a nonionic surfactant, such as polyoxyethylene glycol octylphenol ethers, polyoxyethylene glycol alkylphenol ethers, or other composition. In some embodiments, a remaining composition of the slurry 132 comprises water, deionized water, or other material.

In some embodiments, a cooling liquid is applied during the mechanical polishing process to aid in controlling a temperature of at least one of the semiconductor wafer 102 or the polishing pad 110 during the mechanical polishing process. In some embodiments, the cooling liquid is applied to a surface of the polishing pad 110 facing away from the material layer 118 of the semiconductor wafer 102, such as a top surface of the polishing pad 110 facing away from the oxidized layer 120. In some embodiments, the cooling liquid is applied to a surface of the semiconductor wafer 102 diametrically opposite the material layer 118 of the semiconductor wafer 102, such as a bottom surface of the semiconductor wafer 102 facing away from the polishing pad 110.

Figure 1H:
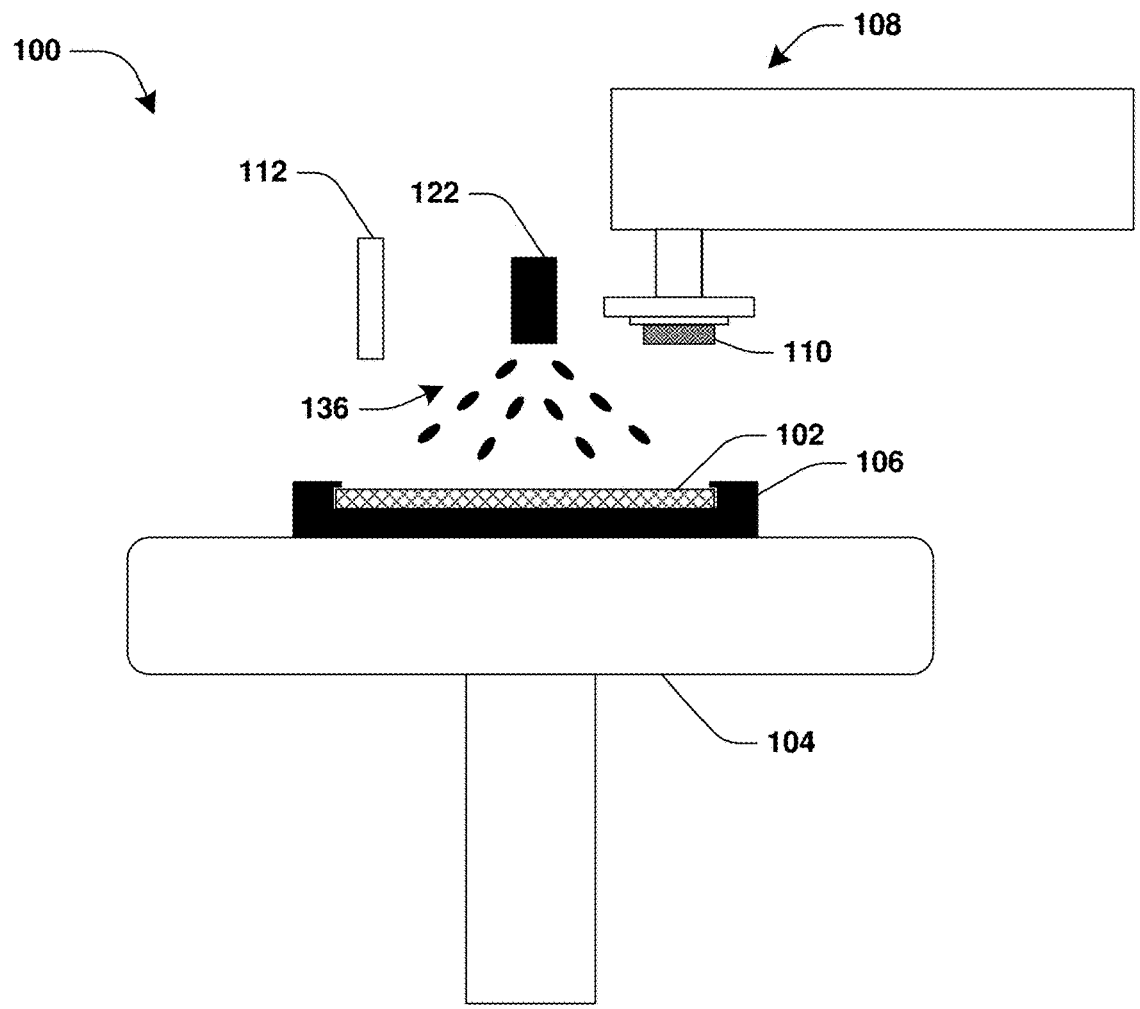
FIG. 1H is an illustration of a rinse being performed upon a wafer, in accordance with some embodiments.

Referring to FIG. 1H, a second rinse is performed after the mechanical polishing process, in accordance with some embodiments. In some embodiments, the rinse apparatus 122 performs the second rinse by dispensing a second rinse material 136 on the semiconductor wafer 102 that removes the slurry 132 and material removed by the mechanical polishing process, such as metal oxide removed from the oxidized layer 120. In some embodiment, the rinse apparatus 122 dispenses the second rinse material 136 while the turntable 104 is rotated to rotate the semiconductor wafer 102 relative to the rinse apparatus 122. In some embodiment, the rinse apparatus 122 dispenses the second rinse material 136 while the turntable 104 is stationary such that a position of the semiconductor wafer 102 is fixed relative to the rinse apparatus 122 while dispensing the second rinse material 136.

Figure 1I:
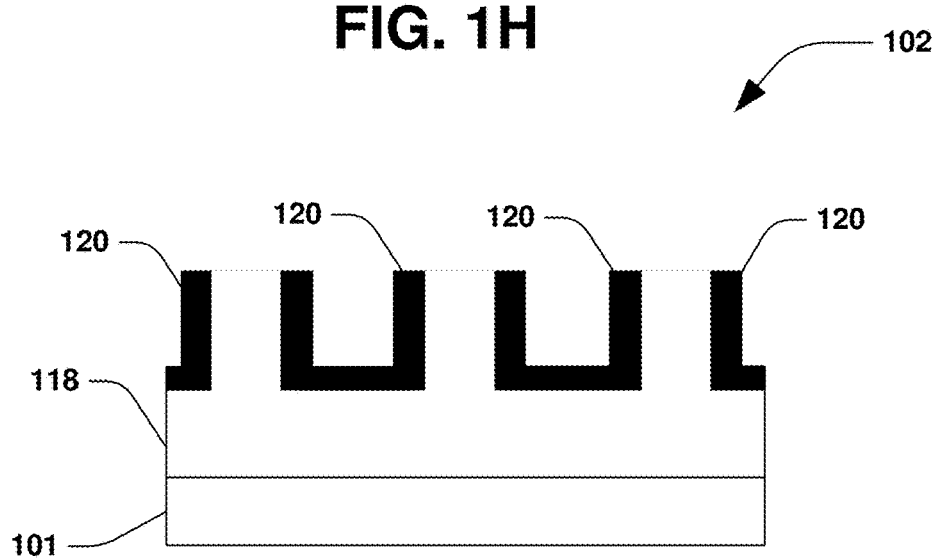
FIG. 1I is an illustration of a cross-sectional view of a wafer, in accordance with some embodiments.

In some embodiments, the second rinse material 136 comprises deionized water or other suitable materials. In some embodiments, the second rinse material 136 comprises the same material as the rinse material 124 used during the first rinse. In some embodiments, the second rinse material 136 comprises a different material than the material as the rinse material 124 used during the first rinse. FIG. 1I is a perspective side view of the semiconductor wafer 102 after the second rinse has been performed.

While the drawings illustrate the material dispensing apparatus 114, the rinse apparatus 122, and the slurry dispensing apparatus 112 as being distinct mechanical element, in some embodiments, at least two of the material dispensing apparatus 114, the rinse apparatus 122, or the slurry dispensing apparatus 112 are the same mechanical element. In such embodiments, an apparatus may be configured to dispense the first chemical substance 116 during a first interval of time, such as during the chemical reaction portion of the polishing process, may be configured to dispense the slurry material during a second interval of time, such as during the mechanical polishing portion of the polishing process, and may be configured to disposed the rinse materials 124, 136 during other intervals of time, such as during the rinse portions of the polishing process.

Figure 2A:
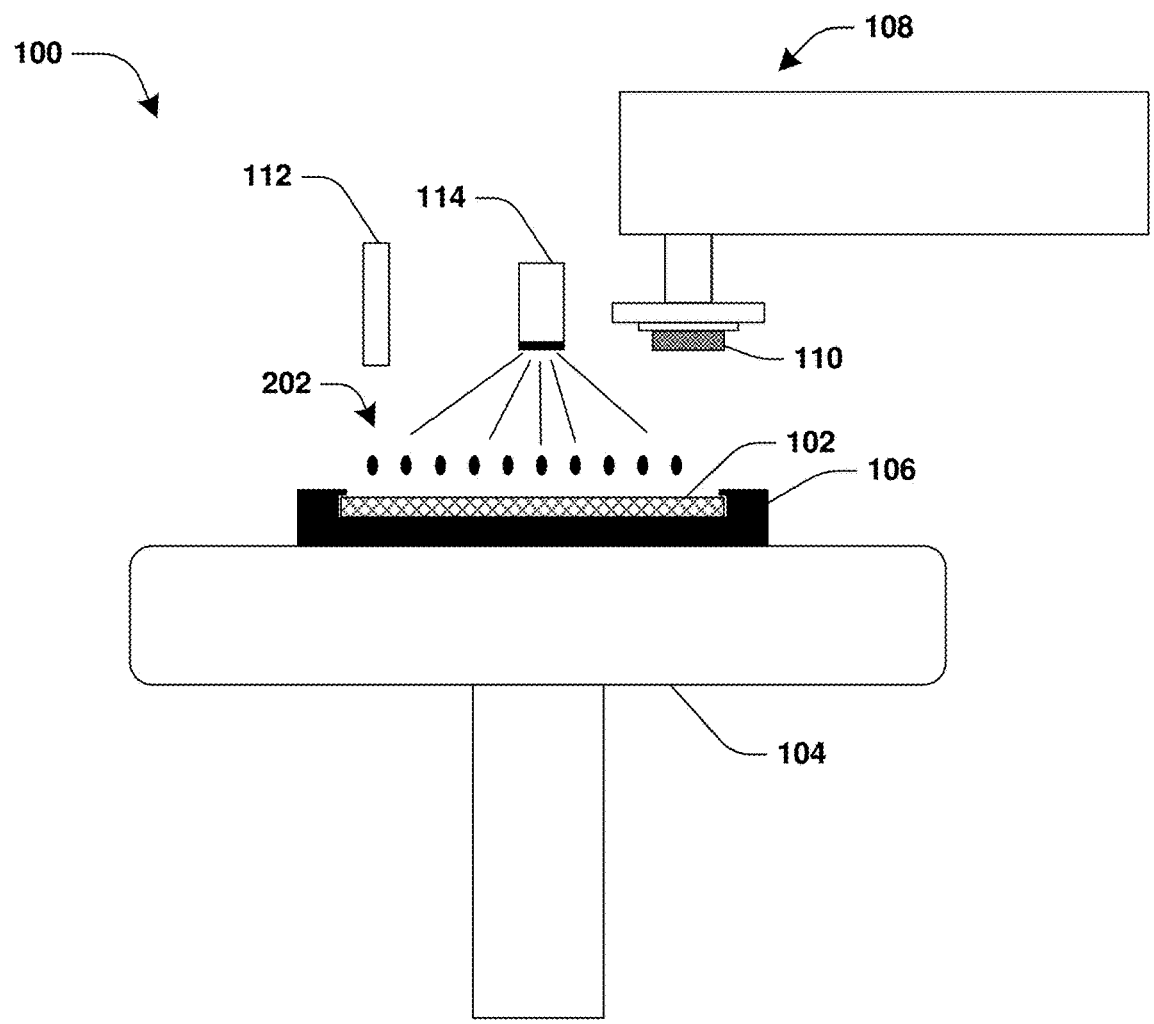
FIG. 2A is an illustration of an oxidization process being performed upon a wafer, in accordance with some embodiments.
Figure 2B:
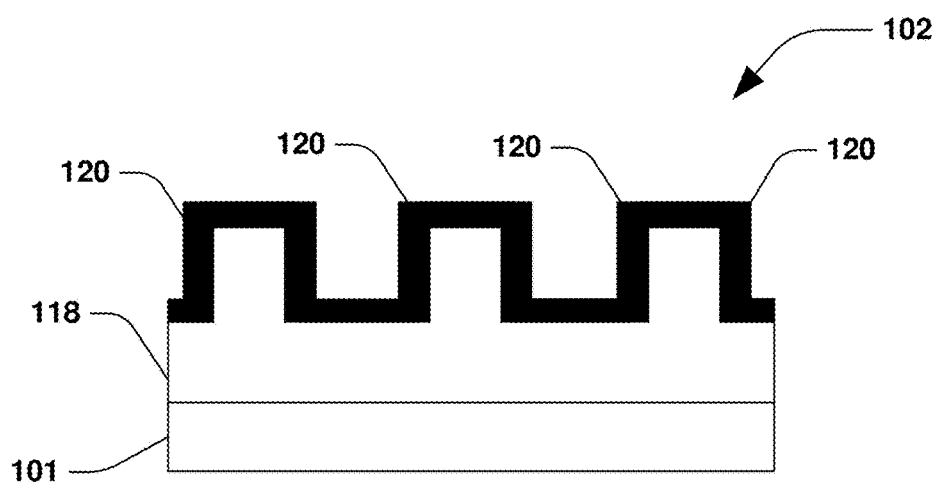
FIG. 2B is an illustration of a cross-sectional view of a wafer, in accordance with some embodiments.

FIGS. 2A-2H are illustrations of a second polishing cycle being performed to remove a second portion of the material layer 118, such as a second portion of the oxidized layer 120. In some embodiments, any number of polishing cycles can be performed by the polishing process. Referring to FIG. 2B, a second chemical reaction is performed by the material dispensing apparatus 114 to change a property of the second portion of the material layer 118 on the semiconductor wafer 102 using a second chemical substance 202. In some embodiments, the second chemical reaction is performed to oxidize the second portion of the material layer 118 to create the oxidized layer 120 depicted in FIG. 2B. The second chemical substance 202 comprises the same substance as or a different substance than the first chemical substance 116 that was previously used to form the oxidized layer 120, as depicted in FIG. 1C, during the first polishing cycle. In some embodiment, the material dispensing apparatus 114 dispenses the second chemical substance 202 while the turntable 104 is rotated to rotate the semiconductor wafer 102 relative to the material dispensing apparatus 114. In some embodiment, the material dispensing apparatus 114 dispenses the second chemical substance 202 while the turntable 104 is stationary such that a position of the semiconductor wafer 102 is fixed relative to the material dispensing apparatus 114 while dispensing the second chemical substance 202.

Figure 2C:
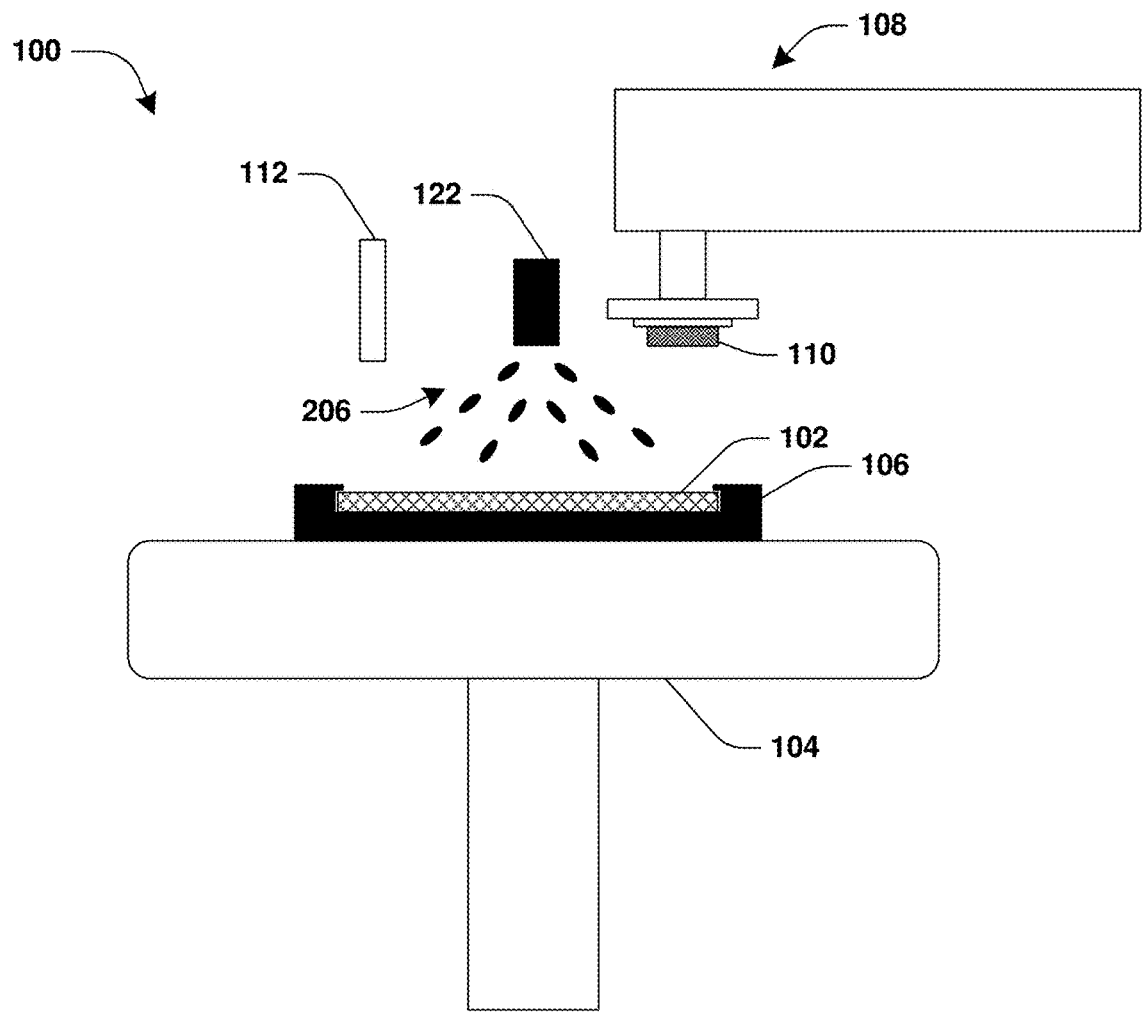
FIG. 2C is an illustration of a rinse being performed upon a wafer, in accordance with some embodiments.

Referring to FIG. 2C, a third rinse is performed after the second chemical reaction, such as the oxidization, is performed, in accordance with some embodiments. In some embodiments, the third rinse is performed to remove the second chemical substance 202 that was used to perform the second chemical reaction. In some embodiments, the third rinse is performed to retard the second chemical reaction. In some embodiments, the rinse apparatus 122 is configured to dispense a third rinse material 206 on the semiconductor wafer 102 to perform the third rinse. In some embodiment, the rinse apparatus 122 dispenses the third rinse material 206 while the turntable 104 is rotated to rotate the semiconductor wafer 102 relative to the rinse apparatus 122. In some embodiment, the rinse apparatus 122 dispenses the third rinse material 206 while the turntable 104 is stationary such that a position of the semiconductor wafer 102 is fixed relative to the rinse apparatus 122 while dispensing the third rinse material 206.

Figure 2D:
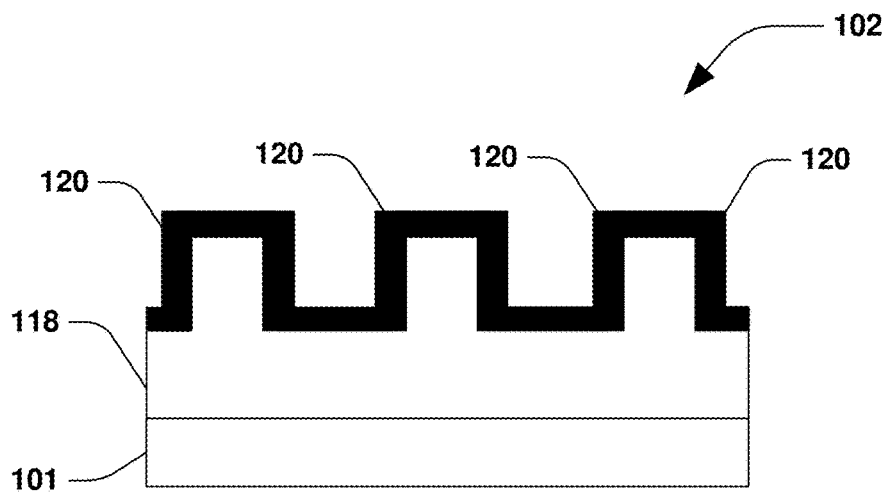
FIG. 2D is an illustration of a cross-sectional view of a wafer, in accordance with some embodiments.

The third rinse material 206 comprises deionized water or other material that will remove the second chemical substance 202 and retard the second chemical reaction. In some embodiments, the third rinse removes remaining oxidizer prior to subsequent mechanical polishing. The third rinse material 206 is the same material as or a different material than at least one of the rinse material 124 used by the first rinse or the second rinse material 136 used by the second rinse. FIG. 2D is a perspective side view of the semiconductor wafer 102 after the third rinse has been performed.

Figure 2E:
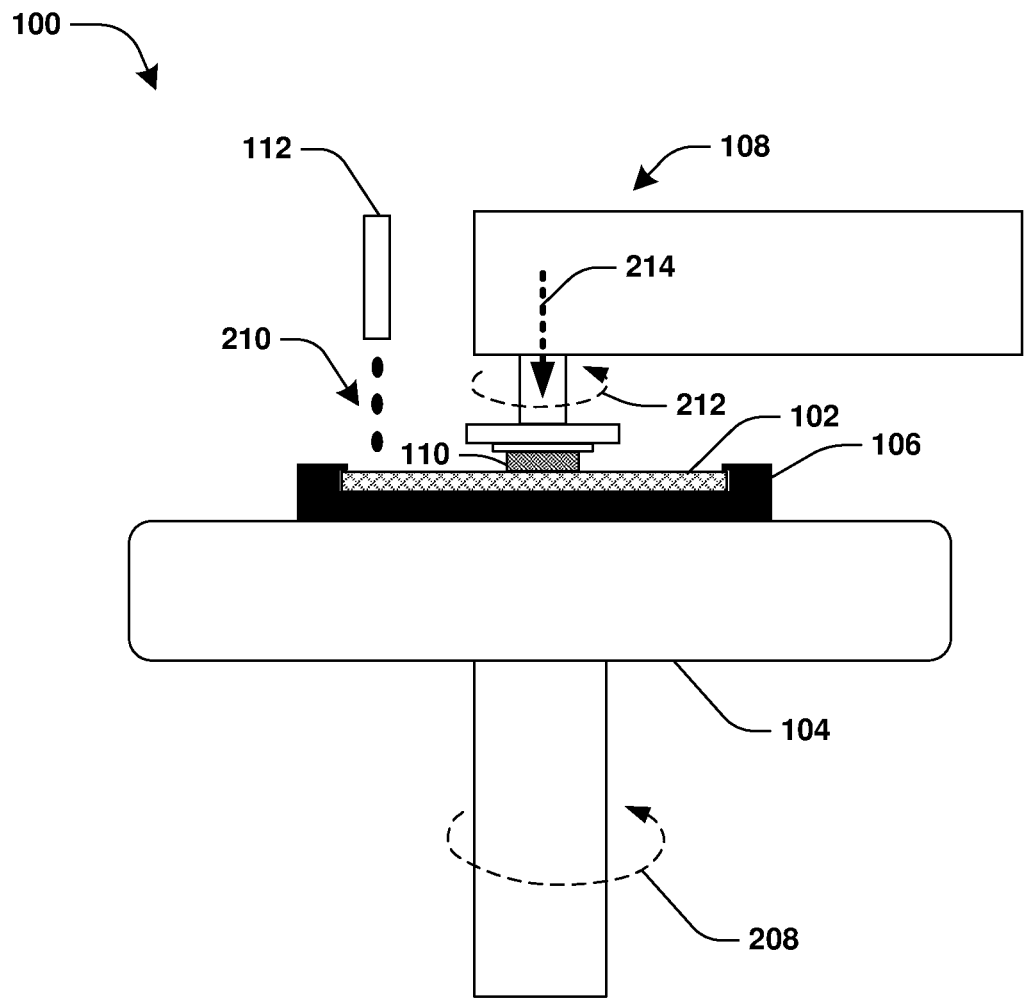
FIG. 2E is an illustration of a mechanical polish being performed upon a wafer, in accordance with some embodiments.
Figure 2F:
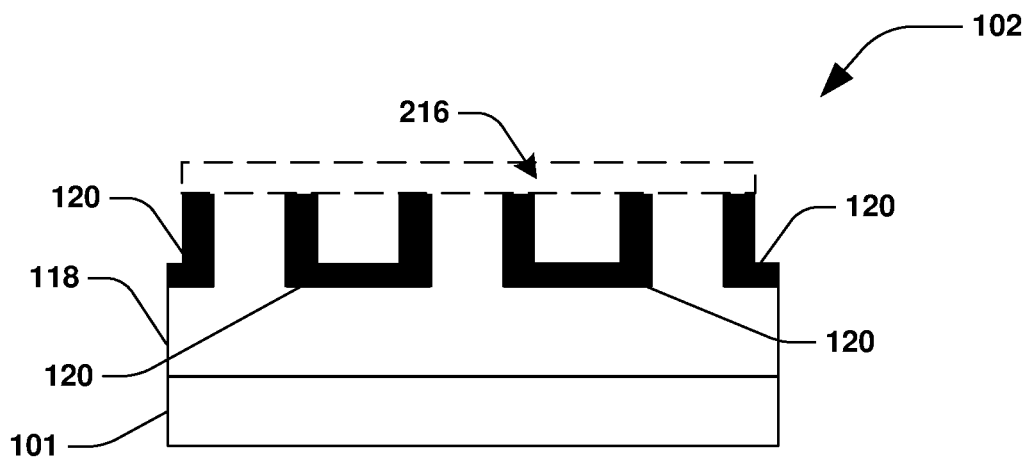
FIG. 2F is an illustration of a cross-sectional view of a wafer, in accordance with some embodiments.

Referring to FIG. 2E, a second mechanical polishing process is performed after the second chemical reaction and after the second rinse is performed to retard the second chemical reaction, in accordance with some embodiments. In some embodiments, the second mechanical polishing process is performed to remove 216 the second portion of the material layer 118, such as a top portion of the oxidized layer 120, as illustrated in FIG. 2F. In some embodiments, during the second mechanical polishing process, the dresser arm 108 is operated to move the polishing pad 110 in contact with the semiconductor wafer 102. In some embodiments, the dresser arm 108 rotates 212 the polishing pad 110 against a surface of the semiconductor wafer 102, such as a top surface of the oxidized layer 120. In some embodiments, the dresser arm 108 is controlled to apply about 0.5 psi or less of pressure 214, such as downward force, against the semiconductor wafer 102 by the polishing pad 110. In some embodiments, the turntable 104 is controlled to apply about 0.5 psi or less of pressure 130, such as upward force, against the polishing pad 110. In some embodiments, the turntable 104 is operated to rotate 208 the semiconductor wafer 102 against the polishing pad 110 during the second mechanical polishing process.

During the second mechanical polishing process the slurry dispensing apparatus 112 is controlled to dispense a second slurry 210 on at least one of the semiconductor wafer 102 or the polishing pad 110. The second slurry 210 is used to aid the second mechanical polishing process to remove 216 the second portion of the material layer 118, such as a portion of the oxidized layer 120, to expose a third portion of the material layer 118 under the second portion of the material layer 118. The second slurry 210 comprises a same concentration of solid content as or a different concentration of solid content than the slurry 132 used by the mechanical polishing process depicted in FIG. 1F. The second slurry 210 comprises abrasive particles having a same size as or different sizes than abrasive particles in the slurry 132 used by the mechanical polishing process depicted in FIG. 1F. The second slurry 210 comprises solid content, such as abrasive particles, having a same material as or a different material than the slurry 132 used by the mechanical polishing process depicted in FIG. 1F. In some embodiments, the second slurry 210 comprises a surfactant, such as an ionized or deionized surfactant, that aids in the removal of the second portion of the material layer 118.

Figure 2G:
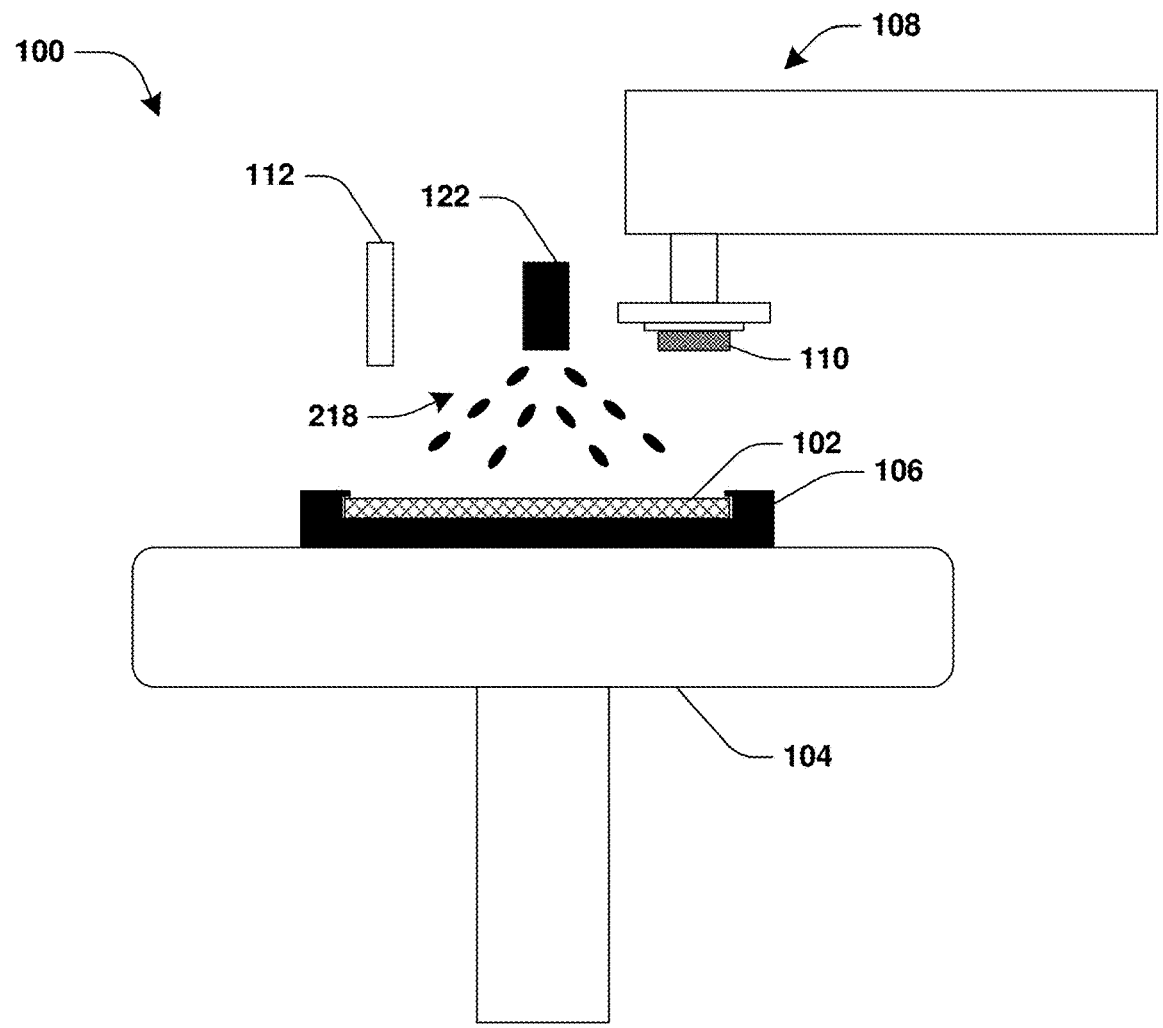
FIG. 2G is an illustration of a rinse being performed upon a wafer, in accordance with some embodiments.

Referring to FIG. 2G, a fourth rinse is performed after the second mechanical polishing process, in accordance with some embodiments. In some embodiments, the rinse apparatus 122 performs the fourth rinse by dispensing a fourth rinse material 218 on the semiconductor wafer 102 that removes the second slurry 210 and material of the material layer 118 removed by the second mechanical polishing process, such as metal oxide removed from the oxidized layer 120. In some embodiment, the rinse apparatus 122 dispenses the fourth rinse material 218 while the turntable 104 is rotated to rotate the semiconductor wafer 102 relative to the rinse apparatus 122. In some embodiment, the rinse apparatus 122 dispenses the fourth rinse material 218 while the turntable 104 is stationary such that a position of the semiconductor wafer 102 is fixed relative to the rinse apparatus 122 while dispensing the fourth rinse material 218.

Figure 2H:
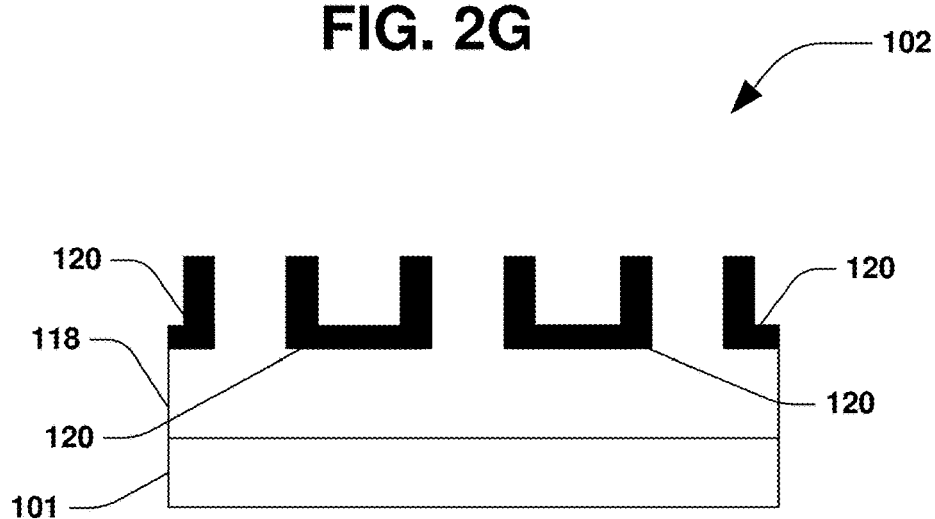
FIG. 2H is an illustration of a cross-sectional view of a wafer, in accordance with some embodiments.

In some embodiments, the fourth rinse material 218 comprises deionized water or other suitable materials. The fourth rinse material 218 comprises the same material as or a different material than at least one of the rinse material 124 used by the first rinse, the second rinse material 136 used by the second rinse, or the third rinse material 206 used by the third rinse. FIG. 2H is a perspective side view of the semiconductor wafer 102 after the fourth rinse has been performed.

Figure 3:
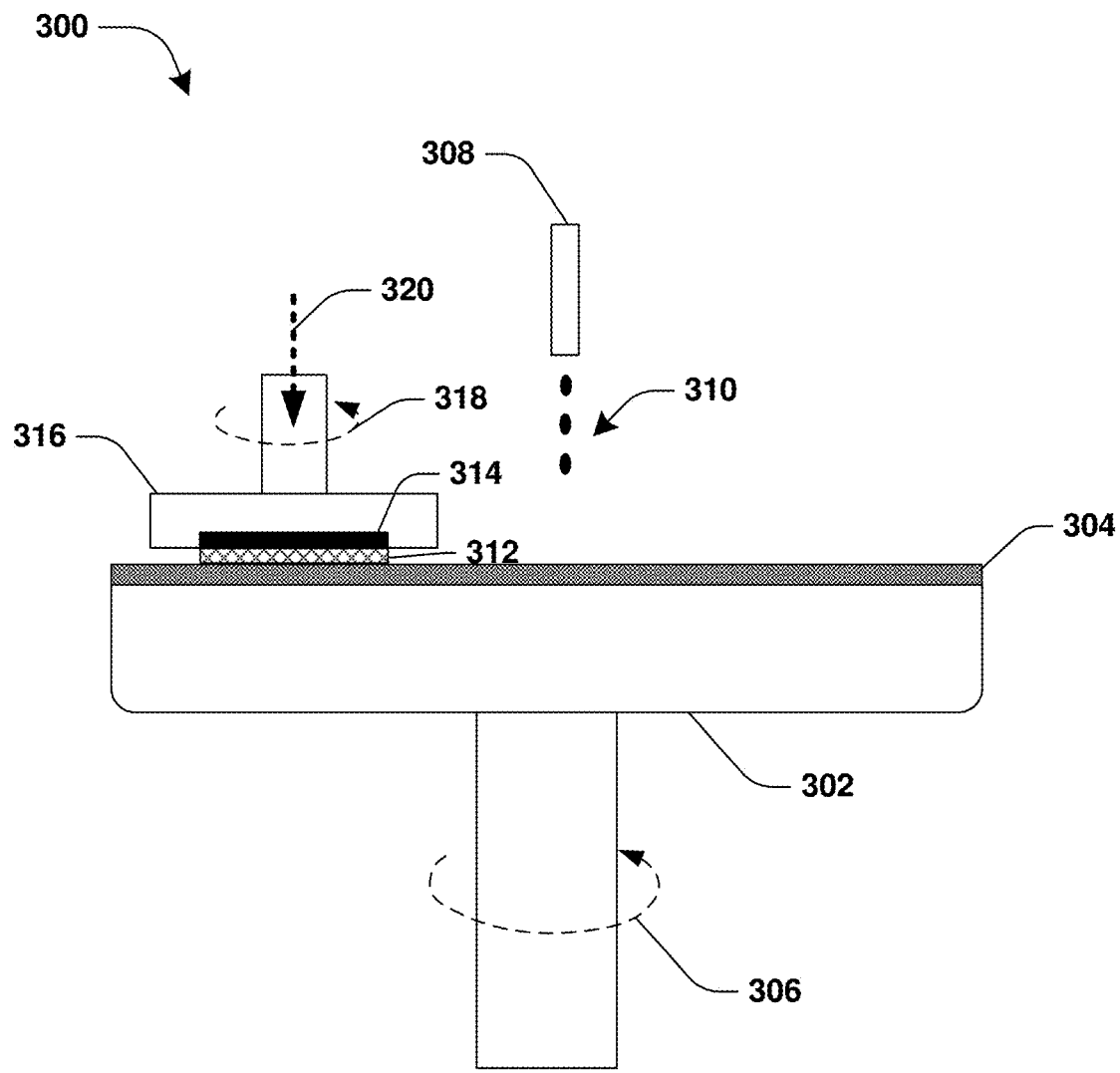
FIG. 3 is an illustration of a wafer being mechanically polished, in accordance with some embodiments.

Referring to FIG. 3, a polishing apparatus 300 polishes a semiconductor wafer 312 face down against a polishing pad 304 using the polishing techniques described herein. In some embodiments, the polishing apparatus 300 comprises a turntable 302 (platen) that can rotate 306 during a polishing process, such as during a chemical reaction portion or a mechanical polishing portion of the polishing process. In some embodiments, a polishing pad 304 is attached to the turntable 302, and thus the turntable 302 rotates the polishing pad 304 against a surface of the semiconductor wafer 312. In some embodiment, the semiconductor wafer 312 is attached to a wafer holder 316 by a carrier film 314. In some embodiments, during the mechanical polishing process, a force 320 of about 0.5 psi or less of pressure is applied to the semiconductor wafer 312 by the wafer holder 316 towards the polishing pad 304. In some embodiments, during the mechanical polishing process, a force of about 0.5 psi or less of pressure is applied against the polishing pad 304 by the turntable 302 towards the semiconductor wafer 312. During the mechanical polishing process, a slurry dispensing apparatus 308 applies a slurry 310 to the polishing pad 304.

In some embodiments, a method for polishing a wafer includes oxidizing a first portion of a material layer on the wafer using a first chemical substance to create an oxidized layer. A first rinse is performed to remove the first chemical substance. A mechanical polishing process is performed to remove the oxidized layer after performing the first rinse.

In some embodiments, a method for polishing a wafer includes performing a chemical reaction to change a property of a first portion of a material layer of the wafer using a first chemical substance. A first rinse is performed to remove the first chemical substance and retard the chemical reaction. A mechanical polishing process is performed to remove the first portion of the material layer after performing the first rinse.

In some embodiments, a method for polishing a wafer includes performing a mechanical polishing process to remove a first portion of a material layer on the wafer. During the mechanical polishing process, a slurry is applied to at least one of the wafer or a polishing pad. The slurry comprises abrasive particles each having a size of 30 nanometers or less. During the mechanical polishing process, 0.5 pounds per square inch or less of pressure is applied against the wafer by the polishing pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, In an or more embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for polishing a wafer, comprising:
   oxidizing a first portion of a material layer on the wafer using a first chemical substance to create a first oxidized layer;
   performing a first rinse to remove the first chemical substance;
   performing a mechanical polishing process to remove the first oxidized layer after performing the first rinse, wherein:
      performing the mechanical polishing process comprises applying a slurry comprising a concentration of solid content of 0.5 weight percentage (wt %) or less to at least one of the wafer or a polishing pad used during the mechanical polishing process, and
      performing the mechanical polishing process comprises exposing a second portion of the material layer under the first oxidized layer; and
   oxidizing the second portion of the material layer using a second chemical substance to create a second oxidized layer, wherein performing the mechanical polishing process comprises removing no more than 2 nanometers of the material layer before oxidizing the second portion.

2. The method of claim 1, comprising:
   performing a second rinse between performing the mechanical polishing process and oxidizing the second portion of the material layer.

3. The method of claim 1, wherein the first chemical substance and the second chemical substance have a same material composition.

4. The method of claim 1, wherein performing the mechanical polishing process comprises applying 0.5 pounds per square inch (psi) or less of pressure against the wafer by the polishing pad.

5. The method of claim 1, wherein the first chemical substance comprises hydrogen peroxide.

6. The method of claim 1, wherein the slurry comprises abrasive particles each having a size of 30 nanometers (nm) or less to at least one of the wafer or the polishing pad.

7. The method of claim 6, wherein the slurry comprises a surfactant.

8. A method for polishing a wafer, comprising:
   performing a first chemical reaction to change a property of a first portion of a material layer on the wafer using a first chemical substance;
   performing a first rinse to remove the first chemical substance and retard the first chemical reaction;
   performing a mechanical polishing process to remove the first portion of the material layer after performing the first rinse, wherein:
      performing the mechanical polishing process comprises applying a cooling liquid to at least one of:
         a surface of the wafer diametrically opposite the material layer, or
         a surface of a polishing pad facing away from the material layer, and
      performing the mechanical polishing process comprises exposing a second portion of the material layer under the first portion; and performing a second chemical reaction to change a property of the second portion of the material layer using a second chemical substance, wherein performing the mechanical polishing process comprises removing no more than 2 nanometers of the material layer before performing the second chemical reaction.

9. The method of claim 8, wherein:

the wafer comprises a plurality of dies, and performing the mechanical polishing process comprises performing the mechanical polishing process upon fewer than all of the plurality of dies.

10. The method of claim 8, wherein performing the mechanical polishing process comprises applying a slurry to the wafer.

11. The method of claim 8, wherein performing the mechanical polishing process comprises applying a slurry comprising abrasive particles each having a size of 30 nanometers (nm) or less to at least one of the wafer or the polishing pad, wherein the abrasive particles are 0.5 weight percent (wt %) or less of the slurry.

12. The method of claim 8, comprising:

performing a second rinse between performing the mechanical polishing process and performing the second chemical reaction to change the property of the second portion of the material layer.

13. The method of claim 8, wherein the first chemical substance and the second chemical substance have a same material composition.

14. The method of claim 8, wherein a material composition of the first chemical substance is different than a material composition of the second chemical substance.

15. The method of claim 8, wherein:

performing the first rinse comprises applying a first fluid, the method comprises performing a second rinse after performing the mechanical polishing process, and performing the second rinse comprises applying a second fluid different than the first fluid.

16. A method for polishing a wafer, comprising:

performing a first chemical reaction to change a property of a first portion of a material layer on the wafer using a first chemical substance, performing a mechanical polishing process to remove the first portion of the material layer on the wafer, comprising:

applying a slurry comprising abrasive particles each having a size of 30 nanometers (nm) or less to at least one of the wafer or a polishing pad; and applying 0.5 pounds per square inch (psi) or less of pressure against the wafer by the polishing pad, wherein:

the size of the abrasive particles, the pressure applied against the wafer, and a speed of rotation of at least one of the polishing pad or a wafer holder holding the wafer during the mechanical polishing process are selected so as to achieve a rate of removal of less than 10 nanometers of the material layer per minute, and performing the mechanical polishing process comprises exposing a second portion of the material layer under the first portion; and performing a second chemical reaction to change a property of the second portion of the material layer using a second chemical substance, wherein performing the mechanical polishing process comprises removing no more than 2 nanometers of the material layer before performing the second chemical reaction.

17. The method of claim 16, wherein a total solid content of the slurry, including the abrasive particles, is 0.5 weight percent (wt %) or less of the slurry.

18. The method of claim 16, wherein a material composition of the first chemical substance is different than a material composition of the second chemical substance.

19. The method of claim 16, wherein the first chemical substance and the second chemical substance have a same material composition.

20. The method of claim 16, wherein at least one of the first chemical substance or the second chemical substance comprises hydrogen peroxide.

\* \* \* \* \*